United States Patent
Lee et al.

(10) Patent No.: US 6,750,545 B1
(45) Date of Patent: Jun. 15, 2004

(54) SEMICONDUCTOR PACKAGE CAPABLE OF DIE STACKING

(75) Inventors: Sun Goo Lee, Seoul (KR); Sang Jae Jang, Seoul (KR); Choon Heung Lee, Kyounggi-do (KR); Akito Yoshida, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/376,988

(22) Filed: Feb. 28, 2003

(51) Int. Cl.$^7$ .................. H01L 23/48; H01L 23/52; H01L 29/40
(52) U.S. Cl. ..................................... 257/777; 257/686
(58) Field of Search ........................... 257/666, 686, 257/723, 777, 779, 780, 787

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,954 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,646,710 A | 3/1987 | Schmid et al. |
| 4,707,724 A | 11/1987 | Suzuki et al. |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |

(List continued on next page.)

FOREIGN PATENT DOCUMENTS

| | | |
|---|---|---|
| DE | 19734794 A1 | 8/1997 |
| EP | 54021117 | 6/1979 |
| EP | 59050939 | 3/1984 |
| EP | 0720225 | 3/1996 |
| EP | 0720234 | 3/1996 |
| EP | 0794572 A2 | 10/1997 |
| EP | 0844665 | 5/1998 |

(List continued on next page.)

OTHER PUBLICATIONS

JEDEC Solid State Product Outline, "2 Lead Header Family Surface Mounted (Peripheral Terminals)", 4 pages.

Mannion, P., "MOSFETs Break Out of the Shackles of Wirebonding", Electronic Design, vol. 47, #6 (Mar. 22, 1999).

(List continued on next page.)

*Primary Examiner*—Wael Fahmy
*Assistant Examiner*—Hoai Pham
(74) *Attorney, Agent, or Firm*—Stetina Brunda Garred & Brucker

(57) ABSTRACT

A stackable semiconductor package. The semiconductor package comprises a plurality of first and second leads which are arranged in a generally quadrangular array having one pair of opposed sides defined by the first leads and one pair of opposed sides defined by the second leads. The first and second leads each include opposed, generally planar first and second surfaces, and a third surface which is also disposed in opposed relation to the second surface and positioned between the first and second surfaces. A first semiconductor die is electrically connected to the third surfaces of the first leads, with a second semiconductor die being electrically connected to the third surfaces of the second leads. A package body at least partially encapsulates the first and second leads and the first and second semiconductor dies such that the first and second surfaces of each of the first and second leads are exposed in the package body.

23 Claims, 15 Drawing Sheets

U.S. PATENT DOCUMENTS

| | | |
|---|---|---|
| 4,935,803 A | 6/1990 | Kalfus et al. |
| 4,942,454 A | 7/1990 | Mori et al. |
| 4,987,475 A | 1/1991 | Schlesinger et al. |
| 5,029,386 A | 7/1991 | Chao et al. |
| 5,041,902 A | 8/1991 | McShane |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasaranthi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,736,432 A | 4/1998 | Mackessy |
| 5,745,984 A | 5/1998 | Cole, Jr. et al. |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,722 A | 7/2000 | Lee et al. |
| 6,100,594 A | 8/2000 | Fukui et al. |

| | | |
|---|---|---|
| 6,113,473 A | 9/2000 | Costantini et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,339,255 B1 | 1/2002 | Shin |
| 6,355,502 B1 | 3/2002 | Kang et al. |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,464,121 B2 | 10/2002 | Reijnders |
| 6,482,680 B1 | 11/2002 | Khor et al. |
| 6,498,099 B1 | 12/2002 | McLellan et al. |
| 6,498,392 B2 | 12/2002 | Azuma |
| 6,507,120 B2 | 1/2003 | Lo et al. |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0140061 A1 | 10/2002 | Lee |
| 2002/0140068 A1 | 10/2002 | Lee et al. |

FOREIGN PATENT DOCUMENTS

| | | |
|---|---|---|
| EP | 0938671 | 8/1999 |
| EP | 0989608 | 3/2000 |
| EP | 1032037 | 8/2000 |
| JP | 55163868 | 12/1980 |
| JP | 5745959 | 3/1982 |
| JP | 59208756 | 11/1984 |
| JP | 59227143 | 12/1984 |
| JP | 60010756 | 1/1985 |
| JP | 60116239 | 8/1985 |
| JP | 60185957 | 10/1985 |
| JP | 60231349 | 11/1985 |
| JP | 6139555 | 2/1986 |
| JP | 629639 | 1/1987 |
| JP | 63205935 | 8/1988 |
| JP | 63233555 | 9/1988 |
| JP | 63249345 | 10/1988 |
| JP | 63316470 | 12/1988 |
| JP | 64054749 | 3/1989 |
| JP | 1106456 | 4/1989 |
| JP | 4098864 | 3/1992 |
| JP | 5129473 | 5/1993 |
| JP | 5168992 | 7/1993 |
| JP | 5283460 | 10/1993 |
| JP | 692076 | 4/1994 |
| JP | 6250532 | 9/1994 |
| JP | 7297344 | 11/1995 |
| JP | 7312405 | 11/1995 |
| JP | 864634 | 3/1996 |
| JP | 8125066 | 5/1996 |
| JP | 8222882 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10199934 | 7/1998 |
| JP | 10256240 | 9/1998 |
| JP | 10022447 | 10/1998 |
| JP | 00150765 | 5/2000 |
| KR | 941979 | 1/1994 |
| KR | 199772358 | 11/1997 |
| KR | 100220154 | 6/1999 |
| KR | 0049944 | 6/2002 |
| WO | 9956316 | 11/1999 |
| WO | 9967821 | 12/1999 |

OTHER PUBLICATIONS

Micro Electronics Packaging Handbook, 1989, edited by R. Tummala & E. Rymaszewski, published by Van Nostrand Reinhold, New York, NY.

National Semiconductor Application Note 1187, "Leadless Leadframe Package (LLP)", Oct. 2002, http://www.national.com/an/AN/AN–1187.pdl.

Vishey Siliconix Press Release, http://www.siliconix.com/www/200/pr98/4430.html, Dec. 9, 1998, pp. 1–3.

SEMICONDUCTOR PACKAGE CAPABLE OF DIE STACKING

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages and, more particularly, to a semiconductor package including a leadframe which is uniquely configured to accommodate stacked semiconductor dies while allowing the resultant semiconductor package to maintain a thin profile.

2. Description of the Related Art

Due to recent advances in the semiconductor packaging arts, there have been developed semiconductor packages fabricated through the use of copper leadframes which are configured in a manner allowing the resultant semiconductor package to have a size which does not substantially exceed that of the semiconductor die mounted to the leadframe. Though being of minimal size, such semiconductor packages possess certain deficiencies which detract from their overall utility.

More particularly, the leadframes of such semiconductor packages are typically configured to allow only a single semiconductor die to be mounted thereto. In certain applications, it is desirable to have multiple semiconductor dies electrically interfaced to a single leadframe. Due to the structural constraints of the small profile leadframes discussed above, the inclusion of multiple semiconductor dies in the semiconductor package necessitates that a first semiconductor die be mounted directly to the leadframe, with a second semiconductor die of identical or reduced size to the first semiconductor die being stacked upon the first semiconductor die. However, such stacking creates difficulties in electrically connecting each of the semiconductor dies to the leads of the leadframe through the use of conductive wires.

Other problems include an excessive increase in the overall thickness of the semiconductor package resulting from the stacking of the semiconductor dies upon each other and upon the leadframe, as well as the reduction in the electrical performance of the semiconductor package attributable to the difficulties in dissipating heat from the semiconductor dies attributable to the stacking thereof. One additional problem lies in the increased length of the signal lines (i.e., the combined lengths of the conductive wires and leads) from the semiconductor dies to an external device, which often results in distortion or deterioration in the characteristics of the transmitted signal. These and other deficiencies of prior art semiconductor packages are alleviated by the present invention which will be described in more detail below.

BRIEF SUMMARY OF THE INVENTION

In accordance with the present invention, there is provided a stackable semiconductor package. The semiconductor package comprises a plurality of first and second leads which are arranged in a generally quadrangular array having one pair of opposed sides defined by the first leads and one pair of opposed sides defined by the second leads. The first and second leads each include opposed, generally planar first and second surfaces, and a third surface which is also disposed in opposed relation to the second surface and positioned between the first and second surfaces. A first semiconductor die is electrically connected to the third surfaces of the first leads, with a second semiconductor die being electrically connected to the third surfaces of the second leads. A package body at least partially encapsulates the first and second leads and the first and second semiconductor dies such that the first and second surfaces of each of the first and second leads are exposed in the package body.

The first and second semiconductor dies in the semiconductor package are arranged in stacked relation to each other, and between the first and second surfaces of each of the first and second leads, thus minimizing the thickness or profile of the semiconductor package. Portions of the first and second leads may be formed to be of variable thickness for purposes of facilitating the electrical connection of the first and second semiconductor dies thereto while in the stacked arrangement.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
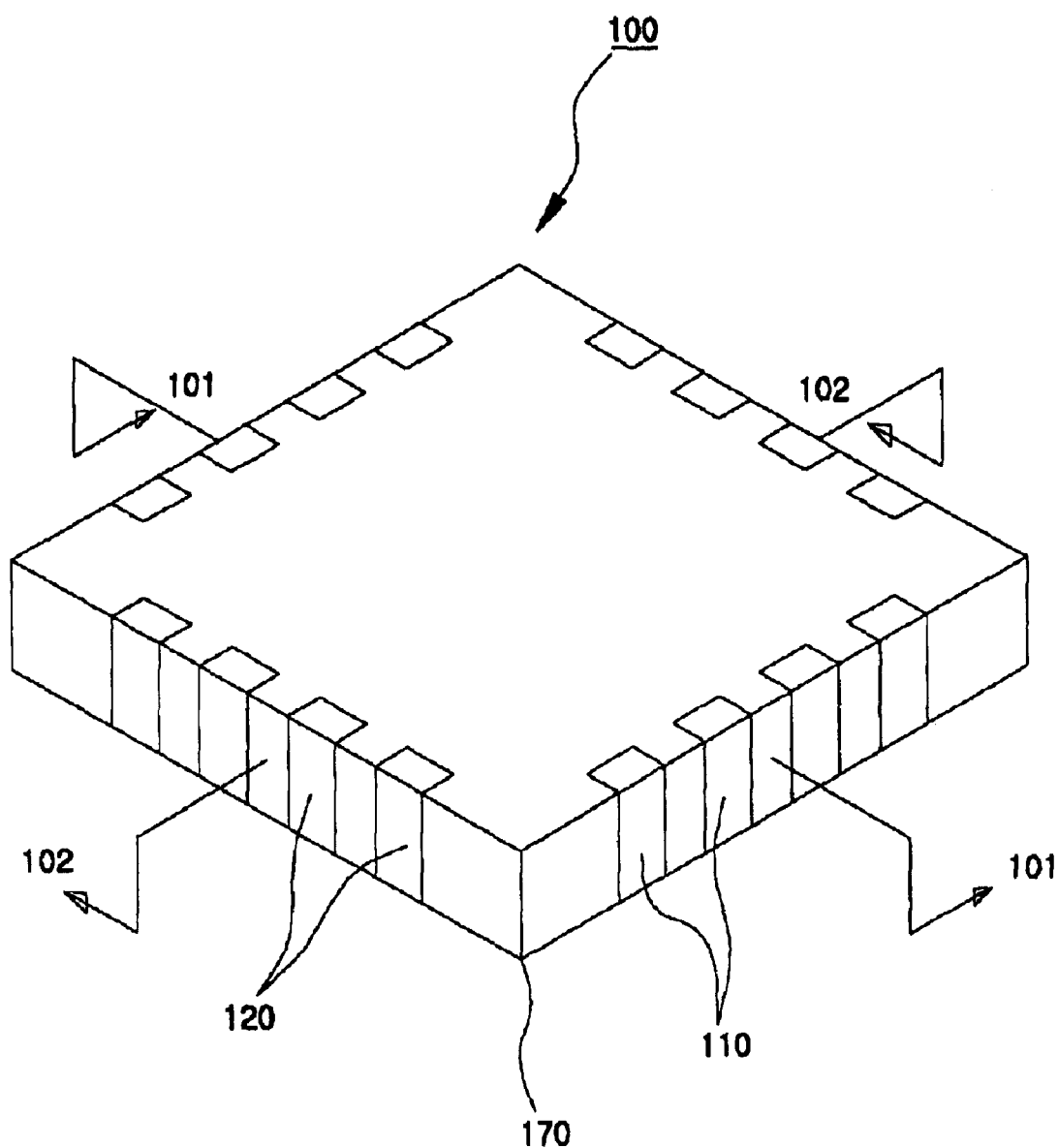
FIG. 1A is a top perspective view of a semiconductor package constructed in accordance with a first embodiment of the present invention.

Referring now to the drawings wherein the showings are for purposes of illustrating various embodiments of the present invention, and not for purposes of limiting the same, FIGS. 1A–3B illustrate a semiconductor package 100 constructed in accordance with a first embodiment of the present invention. As will be discussed below, the semiconductor package 100 is configured to be stackable with a second semiconductor package 100.

Figure 1B:
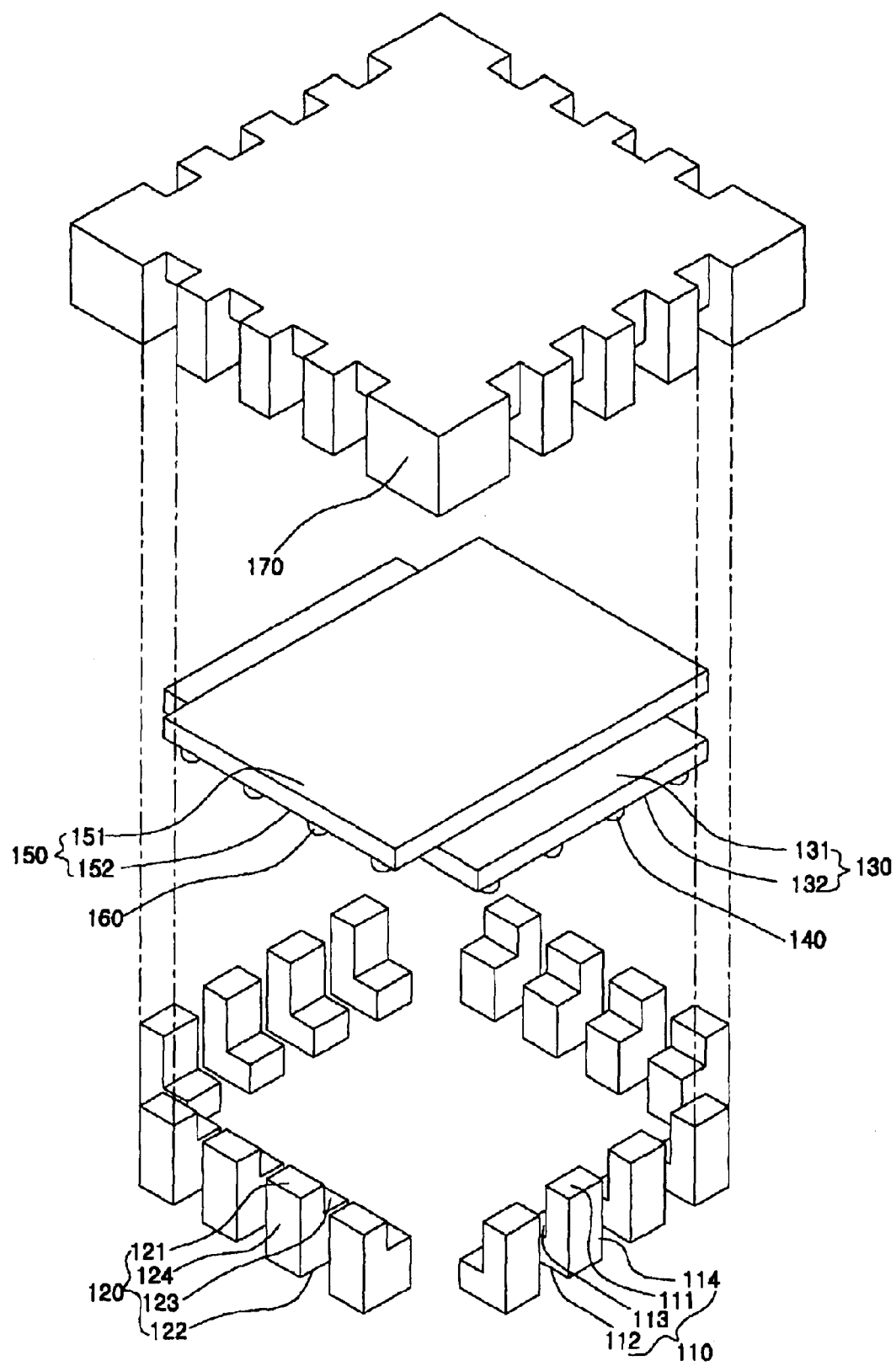
FIG. 1B is an exploded view of the semiconductor package shown in FIG. 1A.

The semiconductor package 100 comprises a plurality of first leads 110 and a plurality of second leads 120. As best seen in FIG. 1B, the first and second leads 110, 120 are arranged in a generally square pattern, with the first leads 110 being segregated into two sets disposed in opposed relation to each other, and the second leads 120 themselves being segregated into two sets disposed in opposed relation to each other. The first leads 110 of one set are aligned with respective ones of the first leads 110 of the remaining set. In like fashion, the second leads 120 of one set are aligned with respective ones of the second leads 120 of the remaining set.

Each of the first leads 110 defines a generally planar first or top surface 111 and a generally planar second or bottom surface 112 which is disposed in opposed relation to the first surface 111. Each first lead 110 further defines a generally planar third surface 113 which is also disposed in opposed relation to the second surface 112 and is disposed between the first and second surfaces 111, 112 (i.e., is laterally offset from the first surface 111). Also defined by each first lead 110 is a generally planar side surface 114 which extends perpendicularly between the first and second surfaces 111, 112.

Each of the second leads 120 has a configuration similar to that of the first leads 110. More particularly, each of the second leads 120 defines a generally planar first or top surface 121 and a generally planar second or bottom surface 122 which is disposed in opposed relation to the first surface 121. Each second lead 120 also defines a generally planar third surface 123 which is also disposed in opposed relation to the second surface 122 and positioned between the first and second surfaces 121, 122 (i.e., the third surface 123 is laterally offset from the first surface 121). Also defined by each second lead 120 is a generally planar side surface 124 which extends perpendicularly between the first and second surfaces 121, 122.

As is most easily seen in FIG. 1B, the distinction between the structural attributes of the first and second leads 110, 120 lies in the thicknesses between the second and third surfaces 112, 113 of the first leads 110 and between the second and third surfaces 122, 123 of the second leads 120. In this regard, the thickness of each second lead 120 between the second and third surfaces 122, 123 thereof exceeds the thickness of each first lead 110 between the second and third surfaces 112, 113 thereof. It is contemplated that the thickness of each first lead 110 between its second and third surfaces 112, 113 is in the range of from about twenty percent to forty percent of the thickness between the first and second surfaces 111, 112 thereof. It is also contemplated that the thickness of each second lead 120 between its second and third surfaces 122, 123 is in the range of from about sixty percent to eighty percent of the thickness between the first and second surfaces 121, 122 thereof.

The first and second leads 110, 120 are preferably formed having the above-described stepped configurations through the implementation of a half-etching technique upon a conventional plate fabricated from copper or another suitable conductive material. Those of ordinary skill in the art will recognize that the present invention is not limited to any particular material for the first and second leads 110, 120.

In addition to the first and second leads 110, 120, the semiconductor package 100 further comprises a first semiconductor die 130 and a second semiconductor die 150. The first semiconductor die 130 defines a generally planar first or top surface 131 and a generally planar second or bottom surface 132 which is disposed in opposed relation to the first surface 131. Disposed on the second surface 132 of the first semiconductor die 130 is a plurality of bond pads 133. The bond pads 133 are arranged in a spaced pair of rows which extend along respective ones of an opposed pair of sides of the first semiconductor die 130.

The second semiconductor die 150 itself defines a generally planar first or top surface 151, and a generally planar second or bottom surface 152 which is disposed in opposed relation to the first surface 151. Disposed on the second surface 152 of the second semiconductor die 150 is a plurality of bond pads 153. The bond pads 153 are also preferably arranged in a spaced pair of rows which extend along respective ones of an opposed pair of sides of the second semiconductor die 150.

Figure 2A:
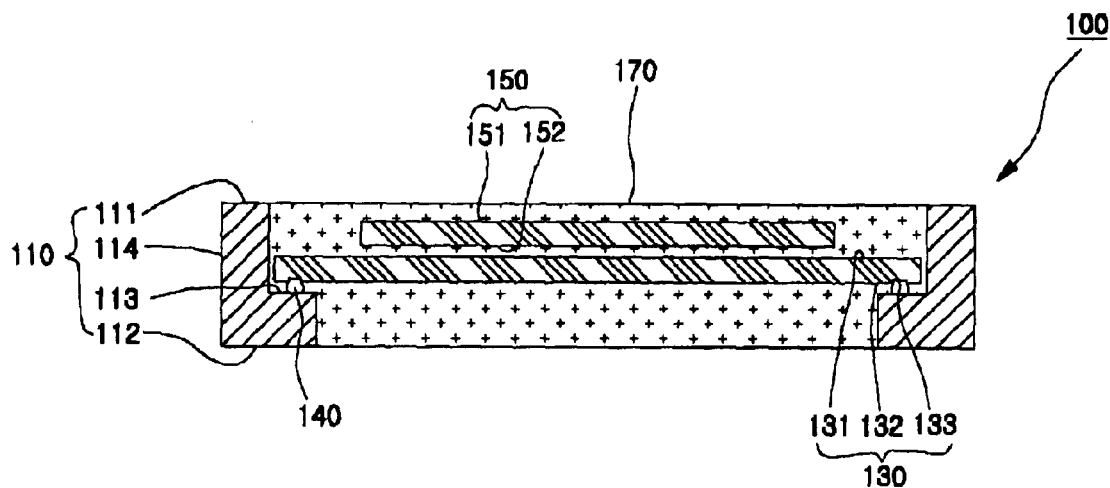
FIG. 2A is a cross-sectional view taken along line 101—101 of FIG. 1A.
Figure 2B:
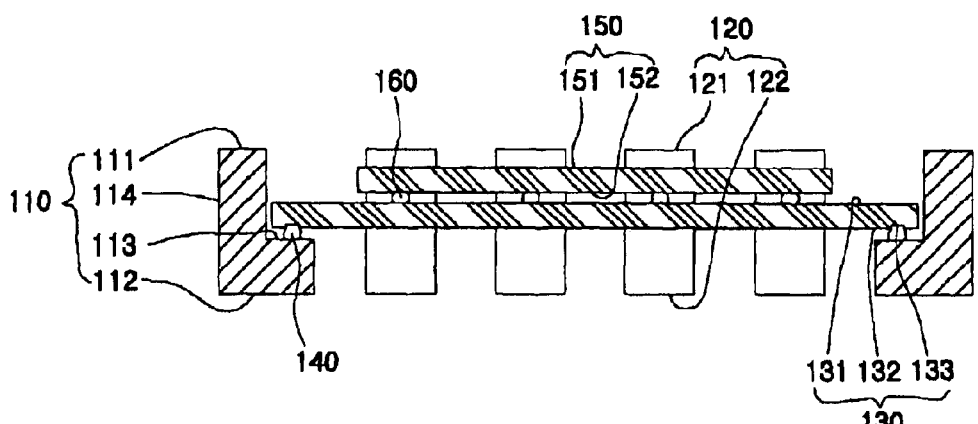
FIG. 2B is a cross-sectional view similar to FIG. 2A, but omitting the package body from the semiconductor package.

As best seen in FIGS. 2A and 2B, in the semiconductor package 100, the first semiconductor die 130 is electrically connected to the first leads 110. Such electrical connection is facilitated through the use of first conductive balls 140 which electrically connect the bond pads 133 of the first semiconductor die 130 to the third surfaces 113 of respective ones of the first leads 110. In this regard, the spacing between the first and second sets of first leads 110 and the spacings between the first leads 110 of each set are such that the bond pads 133 of the first semiconductor die 130 are positionable into overlapping relation to respective ones of the third surfaces 113 of the first leads 110. Accordingly, the first conductive balls 140 are used to facilitate the electrical connection of the bond pads 133 to respective ones of the third surfaces 113 in the above-described manner, thus in turn facilitating the electrical connection of the first semiconductor die 130 to the first leads 110.

Figure 3A:
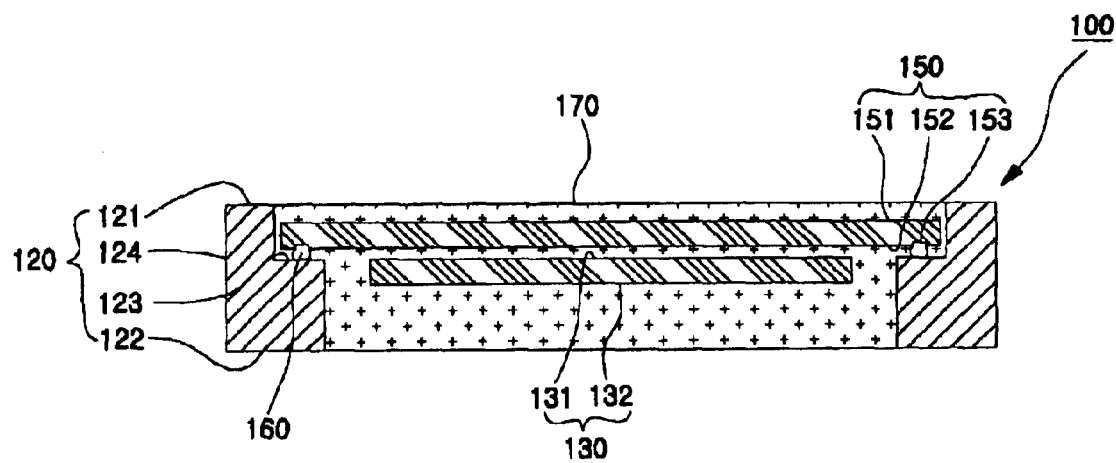
FIG. 3A is a cross-sectional view taken along line 102—102 of FIG. 1A.
Figure 3B:
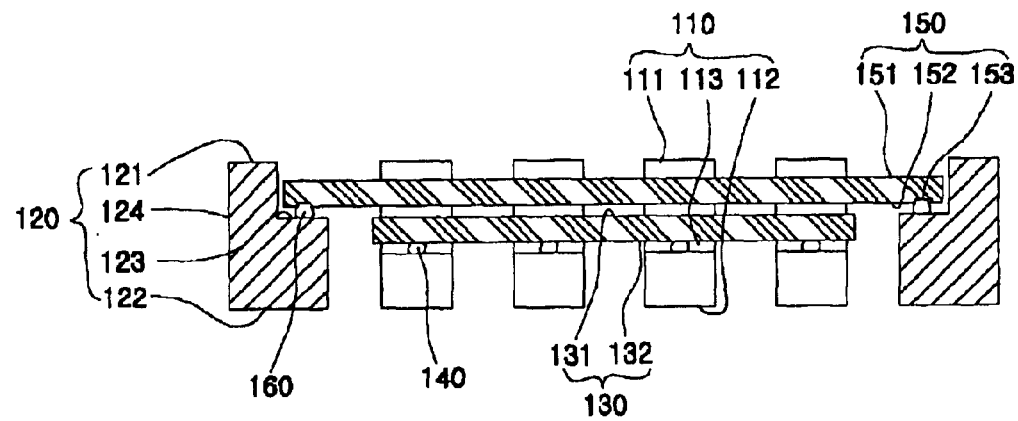
FIG. 3B is a cross-sectional view similar to FIG. 3A, but omitting the package body of the semiconductor package.

In the semiconductor package 100, the second semiconductor die 150 is electrically connected to the second leads 120 in the same manner previously described in relation to the electrical connection of the first semiconductor die 130 to the first leads 110. In this regard, as is seen in FIGS. 3A and 3B, second conductive balls 160 are used to electrically connect the bond pads 153 of the second semiconductor die 150 to the third surfaces 123 of respective ones of the second leads 120. The spacing between the first and second sets of the second leads 120 and between the second leads 120 of each set are such that the bond pads 153 of the second semiconductor die 150 are positionable into overlapping relation to respective ones of the third surfaces 123 of the second leads 120. These relative orientations allow for the electrical connection of the bond pads 153 to respective ones of the third surfaces 123 through the use of the second conductive balls 160, and hence the electrical connection of the second semiconductor die 150 to the second leads 120. The first and second conductive balls 140, 160 may be fabricated from gold, silver, solder, or conductive equivalents. However, those of ordinary skill in the art will recognize that the present invention is not limited to any particular material for the first and second conductive balls 140, 160.

In the semiconductor package 100, the first and second semiconductor dies 130, 150 each have a generally rectangular configuration, and criss-cross each other when electrically connected to respective ones of the first and second leads 110, 120. When the first semiconductor die 130 is electrically connected to the first leads 110 in the above-described manner, the first surface 131 of the first semiconductor die 130 extends in generally co-planar relation to the third surfaces 123 of the second leads 120. When the second semiconductor die 150 is electrically connected to the second leads 120 in the above-described manner, a portion of the second surface 152 of the second semiconductor die 150 overlaps a portion of the first surface 131 of the first semiconductor die 130, but is separated therefrom by a relatively narrow gap. As will be recognized, the width of this gap is approximately equal to the height or thickness of the second conductive balls 160 used to electrically connect the second semiconductor die 150 to the second leads 120. It is preferable that the first surface 131 of the first semiconductor die 130 either extends in generally co-planar relation to the third surfaces 123 of the second leads 120 as described above, or slightly below the third surfaces 123. Advantageously, the thickness variations between the second and third surfaces 112, 113 of the first leads 110 and the second and third surfaces 122, 123 of the second leads 120 allows the first and second semiconductor dies 130, 150 to reside in an area disposed between the first and second surfaces 111, 112 of the first leads 110 and the first and second surfaces 121, 122 of the second leads 120. As will be recognized, the distance separating the first and second surfaces 111, 112 of the first leads 110 from each other is approximately equal to the distance separating the first and second surfaces 121, 122 of the second leads 120 from each other.

In the semiconductor package 100, portions of the first and second leads 110, 120, the first and second semiconductor dies 130, 150, and the first and second conductive balls 140, 160 are encapsulated by an encapsulant material which, upon hardening, forms a package body 170 of the semiconductor package 100. As is best seen in FIG. 1A, in the completed semiconductor package 100, the first, second and side surfaces 111, 112, 114 of each of the first leads 110 and the first, second and side surfaces 121, 122, 124 of each of the second leads 120 are exposed in and substantially flush with corresponding exterior surfaces of the package body 170.

In one preferred method for manufacturing the semiconductor package 100, a leadframe is initially provided which includes the first and second leads 110, 120 having the above-described structural attributes and arranged relative to each other in the above-described pattern. It is contemplated that a substrate, a printed circuit board, or a ceramic substrate may be used as the leadframe, with the present invention not being limited to any particular leadframe material. Thereafter, the first semiconductor die 130 is electrically connected to the first leads 110 in the above-described manner via the first conductive balls 140 which extend between the bond pads 133 of the first semiconductor die 130 and respective ones of the third surfaces 113 of the first leads 110. It is contemplated that the first conductive balls 140 will initially be fused to respective ones of the bond pads 133, with the first conductive balls 140 thereafter being reflowed after being placed into contact with respective ones of the third surfaces 113 of the first leads 110. After such reflow, the first conductive balls 140 are preferably refrigerated, with the completion of the refrigeration process resulting in the firm affixation and electrical connection of the first semiconductor die 130 to the first leads 110.

Thereafter, the second semiconductor die 150 is electrically connected to the second leads 120 in the above-described manner through the use of the second conductive balls 160 which extend between the bond pads 153 of the second semiconductor die 150 and respective ones of the third surfaces 123 of the second leads 120. As described above in relation to the first semiconductor die 130, the second conductive balls 160 are initially fused to respective ones of the bond pads 153, and reflowed after being placed into direct contact with respective ones of the third surfaces 123 of the second leads 120. After the second conductive balls 160 have been reflowed, they are then refrigerated, with the completion of the refrigeration process facilitating the completion of the affixation and electrical connection of the second semiconductor die 150 to the second leads 110.

It will be recognized that as an alternative to the above-described process, the first and second conductive balls 140, 160 may be reflowed and thereafter refrigerated simultaneously as opposed to such reflow and refrigeration being completed in consecutive steps. Subsequent to the electrical connection of the first semiconductor die 130 to the first leads 110 and the second semiconductor die 150 to the second leads 120, the first and second leads 110, 120 and first and second semiconductor dies 130, 150 are placed into a mold of a predetermined shape, with the encapsulating material used to form the package body 170 thereafter being injected into the mold. The mold is shaped such that upon the hardening of the encapsulating material, the first, second and side surfaces 111, 112, 114 of each of the first leads 110 and the first, second and side surfaces 121, 122, 124 of each of the second leads 120 are exposed within the package body 170 as indicated above.

Figure 4A:
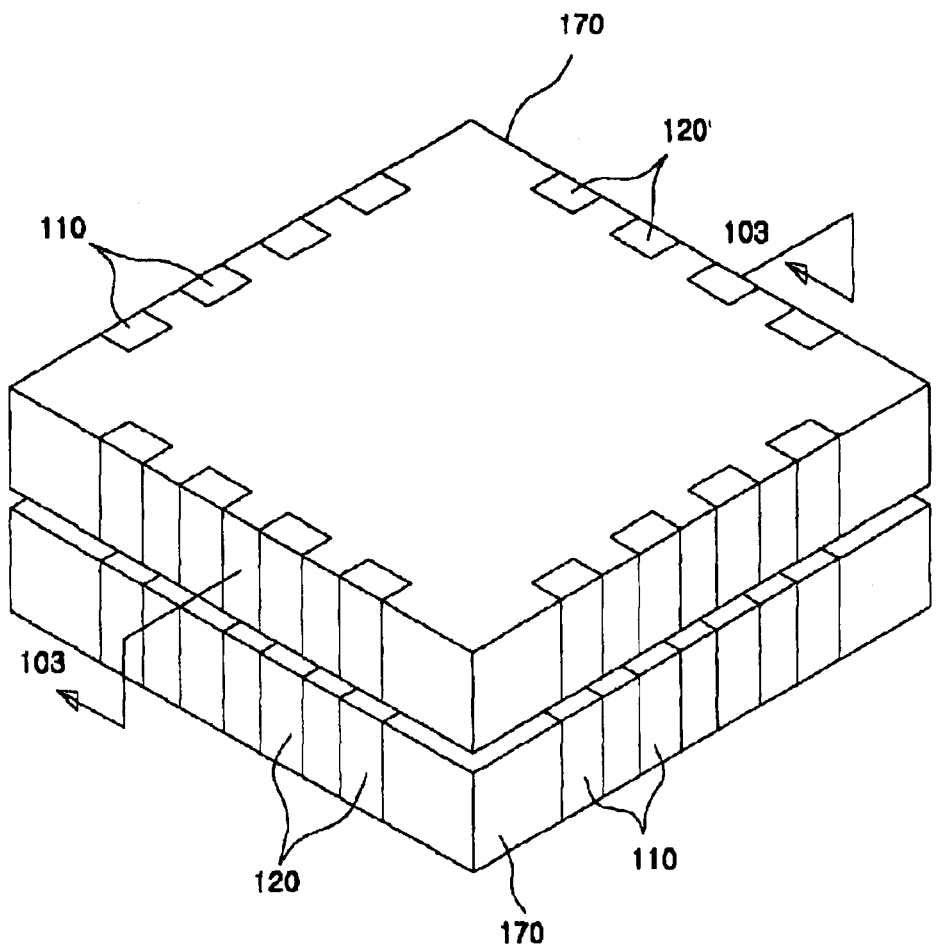
FIG. 4A is a top perspective view of a chip stack assembled through the use of a pair of semiconductor packages constructed in accordance with the first embodiment of the present invention.
Figure 4B:
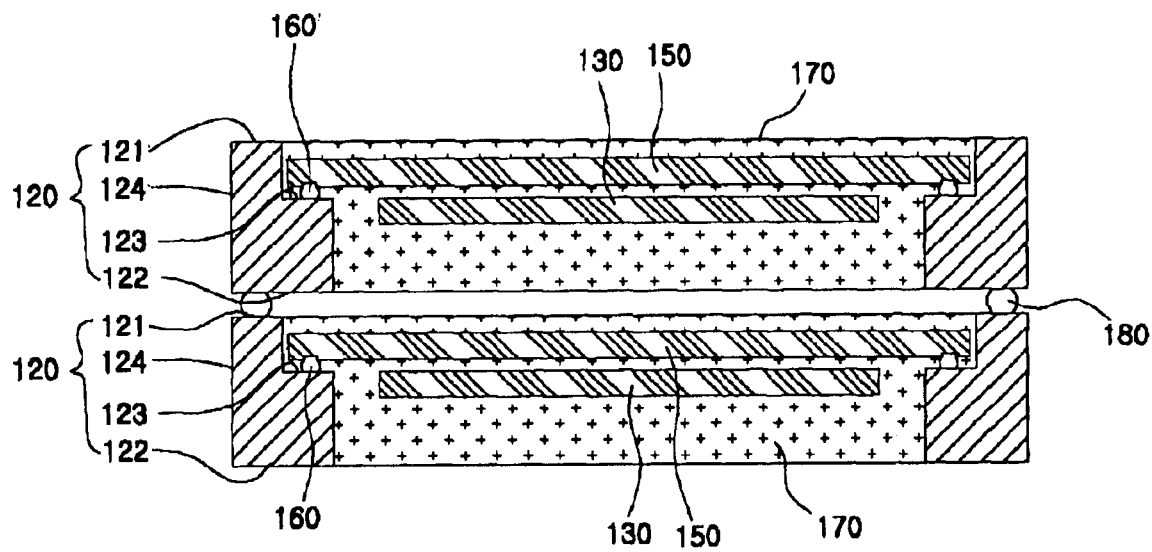
FIG. 4B is a cross-sectional view taken along line 103—103 of FIG. 4A.

Referring now to FIGS. 4A and 4B, the semiconductor package 100 of the first embodiment is capable of being vertically stacked with a second semiconductor package 100. To facilitate such vertical stacking, conductive balls 180 are used to electrically connect the second surfaces 112, 122 of the first and second leads 110, 120 of an upper semiconductor package 100 to respective ones of the first surfaces 111, 121 of the first and second leads 110, 120 of a lower semiconductor package 100. Though FIGS. 4A and 4B depict two semiconductor packages 100 being attached to each other in a stack, those of ordinary skill in the art will recognize that such stack may be assembled to include more than two semiconductor packages 100.

Referring now to FIGS. 5A–7B, there is shown a stackable semiconductor package 200 constructed in accordance with a second embodiment of the present invention. The semiconductor package 200 comprises a plurality of first leads 210 and a plurality of second leads 220. As best seen in FIG. 5B, the first and second leads 210, 220 are arranged in a generally square pattern, with the first leads 210 being segregated into two sets disposed in opposed relation to each other, and the second leads 220 themselves being segregated into two sets disposed in opposed relation to each other. The first leads 210 of one set are aligned with respective ones of the first leads 210 of the remaining set. In like fashion, the second leads 220 of one set are aligned with respective ones of the second leads 220 of the remaining set.

Each of the first leads 210 defines a generally planar first or top surface 211 and a generally planar second or bottom surface 212 which is disposed in opposed relation to the first surface 211. Each first lead 210 further defines a generally planar third surface 213 which is also disposed in opposed relation to the second surface 212 and is disposed between the first and second surfaces 211, 212 (i.e., is laterally offset from the first surface 211). Also defined by each first lead 210 is a generally planar side surface 214 which extends perpendicularly between the first and second surfaces 211, 212.

Each of the second leads 220 is identically configured to the first leads 210. In this regard, each of the second leads 220 defines a generally planar first or top surface 221 and a generally planar second or bottom surface 222 which is disposed in opposed relation to the first surface 221. Each second lead 220 also defines a generally planar third surface 223 which is also disposed in opposed relation to the second surface 222 and positioned between the first and second surfaces 221, 222 (i.e., the third surface 223 is laterally offset from the first surface 221). Also defined by each second lead 220 is a generally planar side surface 224 which extends perpendicularly between the first and second surfaces 221, 222.

Figure 5A:
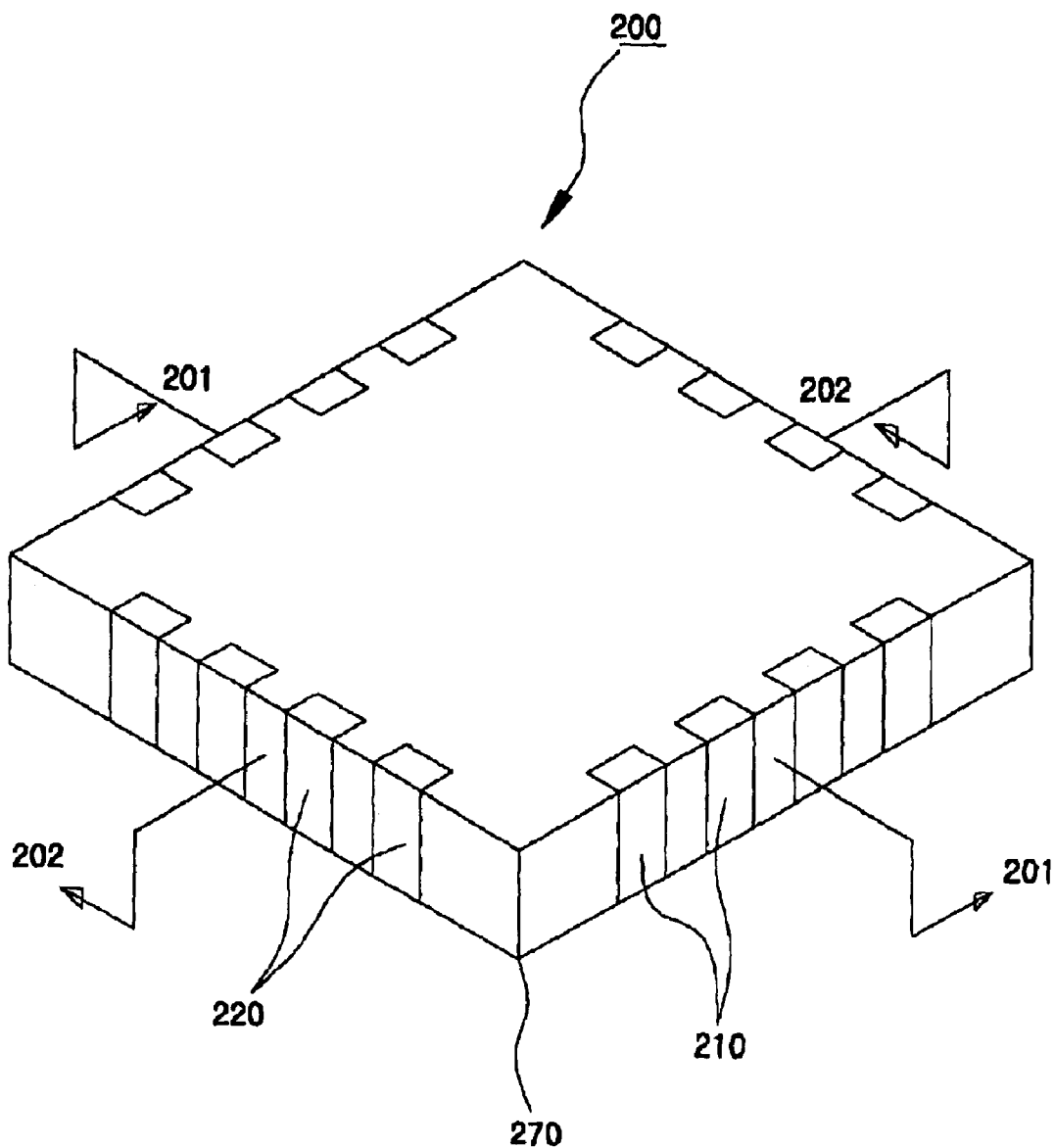
FIG. 5A is a top perspective view of a semiconductor package constructed in accordance with a second embodiment of the present invention.
Figure 5B:
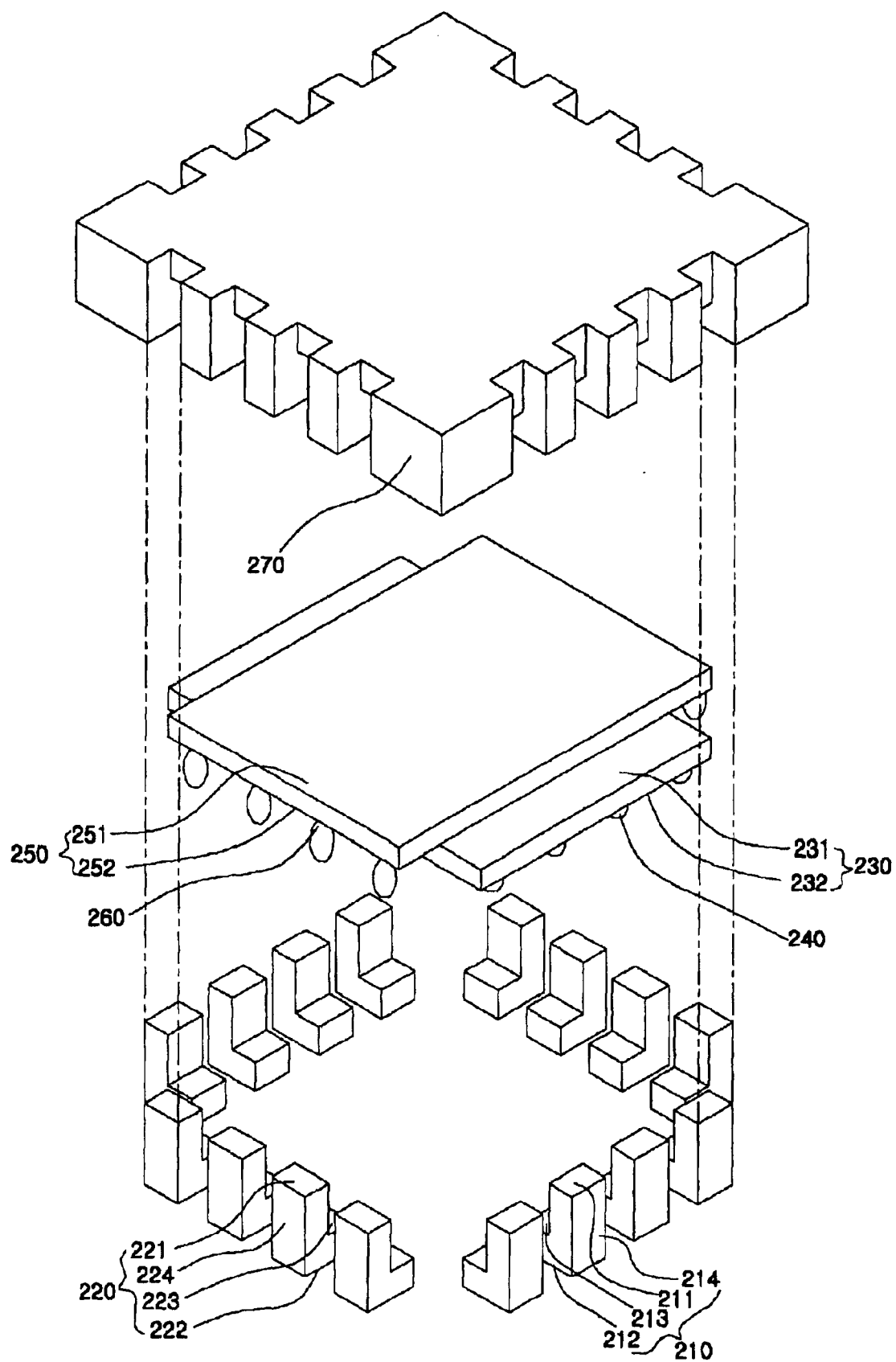
FIG. 5B is an exploded view of the semiconductor package shown in FIG. 5A.

As is most easily seen in FIG. 5B, in the semiconductor package 200, the thickness between the second and third surfaces 212, 213 of the first leads 210 is substantially equal to the thickness between the second and third surfaces 222, 223 of the second leads 220. Additionally, the thickness between the first and second surfaces 211, 212 of the first leads 210 is substantially equal to the thickness between the first and second surfaces 221, 222 of the second leads 220. Thus, as indicated above, the first and second leads 210, 220 are identically configured to each other. The first and second leads 210, 220 are also preferably formed in the above-described stepped configurations through the implementation of a half-etching technique upon a conventional plate fabricated from a suitable conductive material.

In addition to the first and second leads 210, 220, the semiconductor package 200 further comprises a first semiconductor die 230 and a second semiconductor die 250. The first semiconductor die 230 defines a generally planar first or top surface 231 and a generally planar second or bottom surface 232 which is disposed in opposed relation to the first surface 231. Disposed on the second surface 232 of the first semiconductor die 230 is a plurality of bond pads 233. The bond pads 233 are arranged in a spaced pair of rows which extend along respective ones of an opposed pair of sides of the first semiconductor die 230.

The second semiconductor die 250 itself defines a generally planar first or top surface 251, and a generally planar second or bottom surface 252 which is disposed in opposed relation to the first surface 251. Disposed on the second surface 252 of the second semiconductor die 250 is a plurality of bond pads 253. The bond pads 253 are also preferably arranged in a spaced pair of rows which extend along respective ones of an opposed pair of sides of the second semiconductor die 250.

Figure 6A:
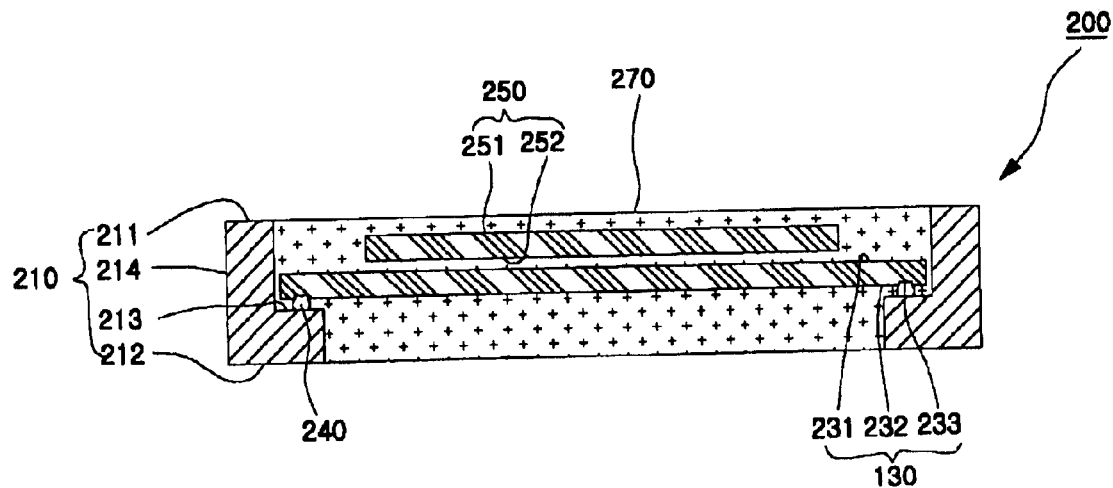
FIG. 6A is a cross-sectional view taken along line 201—201 of FIG. 5A.
Figure 6B:
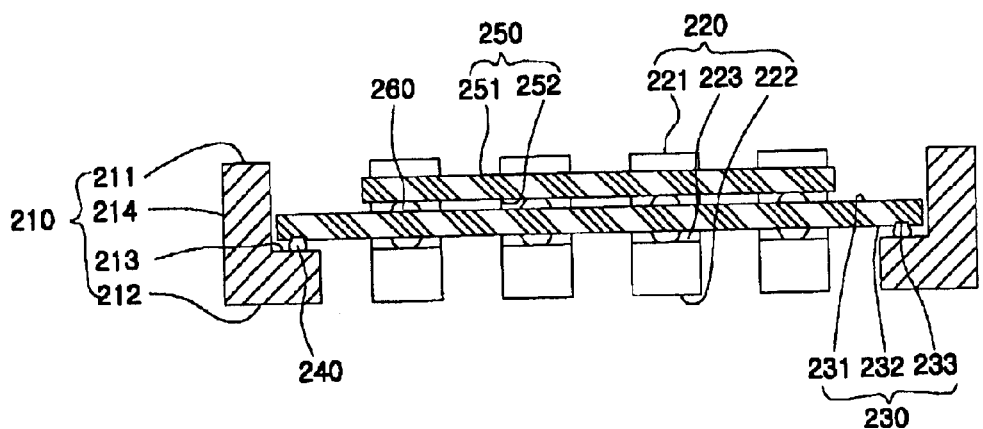
FIG. 6B is a cross-sectional view similar to FIG. 6A, but omitting the package body of the semiconductor package.

As best seen in FIGS. 6A and 6B, in the semiconductor package 200, the first semiconductor die 230 is electrically connected to the first leads 210. Such electrical connection is facilitated through the use of first conductive balls 240 which electrically connect the bond pads 233 of the first semiconductor die 230 to the third surfaces 213 of respective ones of the first leads 210. In this regard, the spacing between the first and second sets of first leads 210 and the spacing between the first leads 210 of each set are such that the bond pads 233 of the first semiconductor die 230 are positionable into overlapping relation to respective ones of the third surfaces 213 of the first leads 210. Accordingly, the first conductive balls 240 are used to facilitate the electrical connection of the bond pads 233 to respective ones of the third surfaces 213 in the above-described manner, thus in turn facilitating the electrical connection of the first semiconductor die 230 to the first leads 210.

Figure 7A:
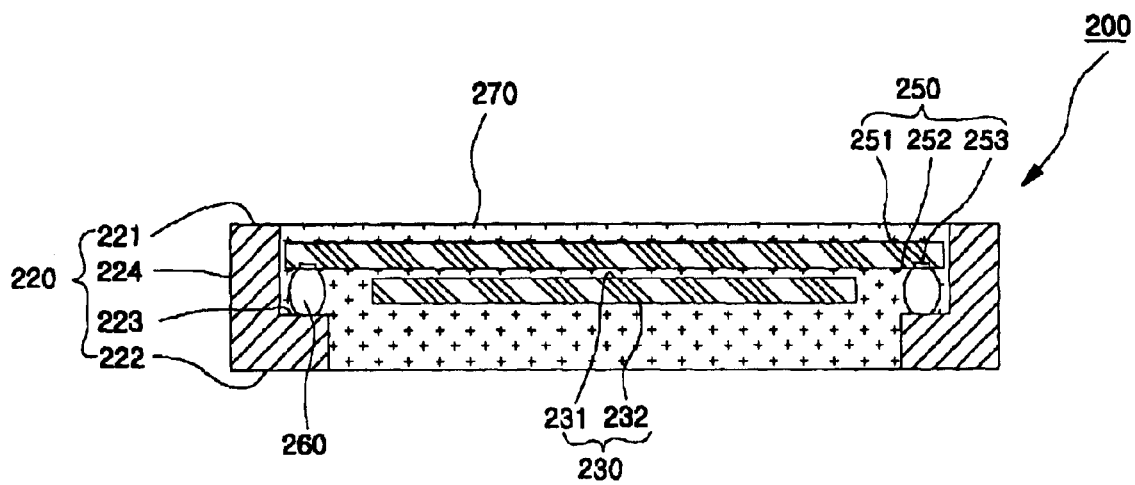
FIG. 7A is a cross-sectional view taken along line 202—202 of FIG. 5A.
Figure 7B:
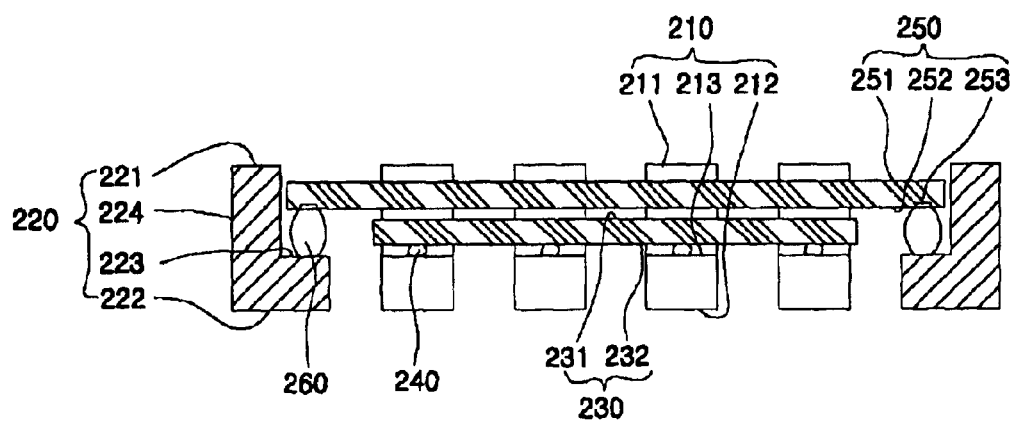
FIG. 7B is a cross-sectional view similar to FIG. 7A, but omitting the package body of the semiconductor package.

The second semiconductor die 250 is itself electrically connected to the second leads 220. In this regard, as seen in FIGS. 7A and 7B, second conductive balls 260 are used to electrically connect the bond pads 253 of the second semiconductor die 250 to the third surfaces 223 of respective ones of the second leads 220. The spacing between the first and second sets of the second leads 220 and between the second leads 220 of each set are such that the bond pads 253 of the second semiconductor die 250 are positionable into overlapping relation to respective ones of the third surfaces 223 of the second leads 220. These relative orientations allow for the electrical connection of the bond pads 253 to respective ones of the third surfaces 223 through the use of the second conductive balls 260, and hence the electrical connection of the second semiconductor die 250 to the second leads 220.

Due to the third surfaces 213, 223 of the first and second leads 210, 220 extending in generally co-planar relation to each other, the second conductive balls 260 used to electrically connect the second semiconductor die 250 to the second leads 220 are sized to have thicknesses substantially exceeding those of the first conductive balls 240 used to electrically connect the first semiconductor die 230 to the first leads 210. Due to the second conductive balls 260 having a size exceeding those of the first conductive balls 240, the electrical connection of the second semiconductor die 250 to the second leads 220 in the above-described manner subsequent to the electrical connection of the first semiconductor die 230 to the first leads 210 in the above-described manner results in a portion of the second surface 252 of the second semiconductor die 250 overlapping a portion of the first surface 231 of the first semiconductor die 230. However, the second surface 252 of the second semiconductor die 250 is still separated or spaced from the first surface 231 of the first semiconductor die 230 by a relatively narrow gap. As with the first and second semiconductor dies 130, 150 described above, the first and second semiconductor dies 230, 250 each have a generally rectangular configuration, and criss-cross each other when electrically connected to respective ones of the first and second leads 210, 220. Advantageously, the thickness variations between the first and second conductive balls 240, 260 allow the first and second semiconductor dies 230, 250 to reside in an area disposed between the first and second surfaces 211, 212 of the first leads 210 and the first and second surfaces 221, 222 of the second leads 220.

In the semiconductor package 200, portions of the first and second leads 210, 220, the first and second semiconductor dies 230, 250, and the first and second conductive balls 240, 260 are encapsulated by an encapsulant material which, upon hardening, forms a package body 270 of the semiconductor package 200. As is best seen in FIG. 5A, in the completed semiconductor package 200, the first, second and side surfaces 211, 212, 214 of each of the first leads 210 and the first, second and side surfaces 221, 222, 224 of each of the second leads 220 are exposed in and substantially flush with corresponding exterior surfaces of the package body 270.

Preferred methodologies for manufacturing the semiconductor package 200 mirror those described above in relation to the semiconductor package 100. The sole variation in such methodologies is that the second conductive balls 260 initially fused to the bond pads 253 of the second semiconductor die 250 will have a size or thickness exceeding those of the first conductive balls 240 fused to the bond pads 233 of the first semiconductor die 230.

Figure 8A:
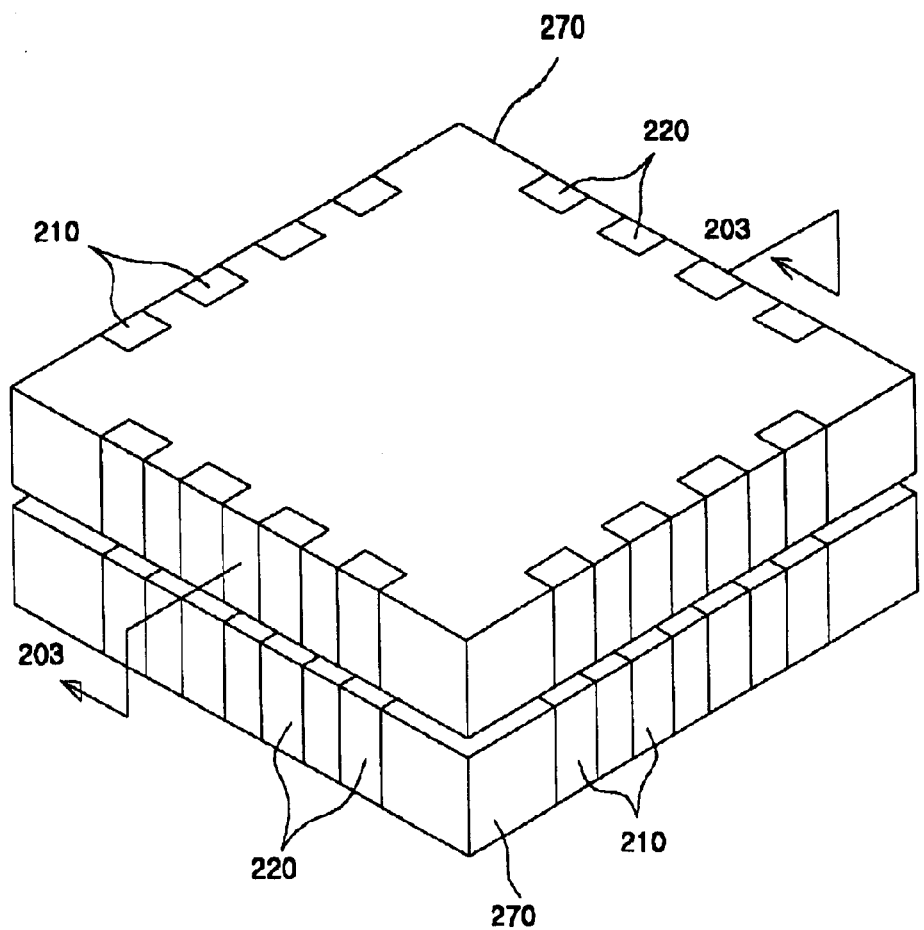
FIG. 8A is a top perspective view of a chip stack assembled through the use of a pair of semiconductor packages constructed in accordance with the second embodiment of the present invention.
Figure 8B:
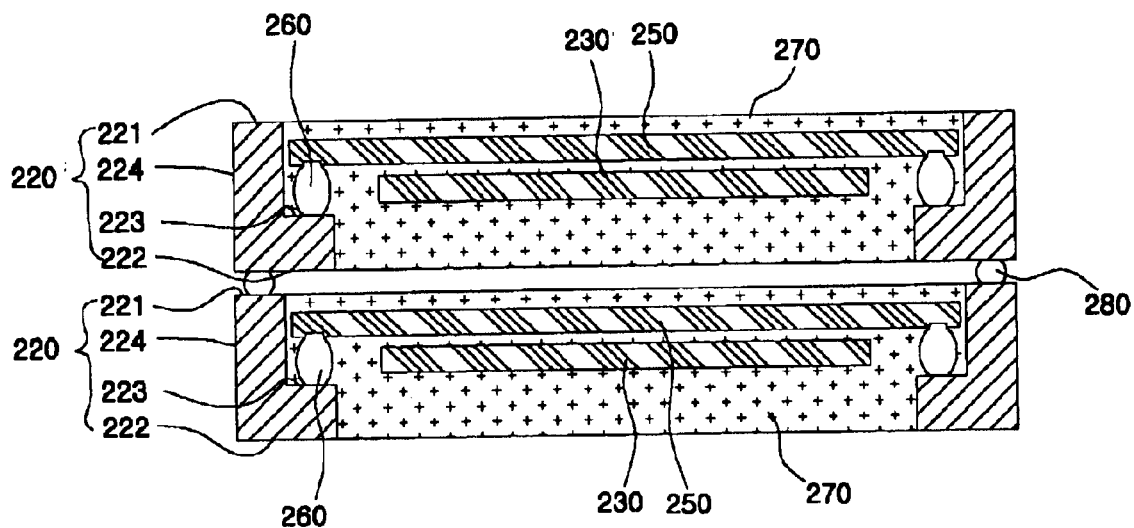
FIG. 8B is a cross-sectional view taken along line 203—203 of FIG. 8A.

Referring now to FIGS. 8A and 8B, the semiconductor package 200 of the second embodiment is also capable of being vertically stacked with a second semiconductor package 200. To facilitate such vertical stacking, conductive balls 280 are used to electrically connect the second surfaces 212, 222 of the first and second leads 210, 220 of an upper semiconductor package 200 to respective ones of the first surfaces 211, 221 of the first and second leads 210, 220 of a lower semiconductor package 200. Though FIGS. 8A and 8B depict two semiconductor packages 200 being attached to each other in a stack, those of ordinary skill in the art will recognize that such stack may be assembled to include more than two semiconductor packages 200.

Figure 9:
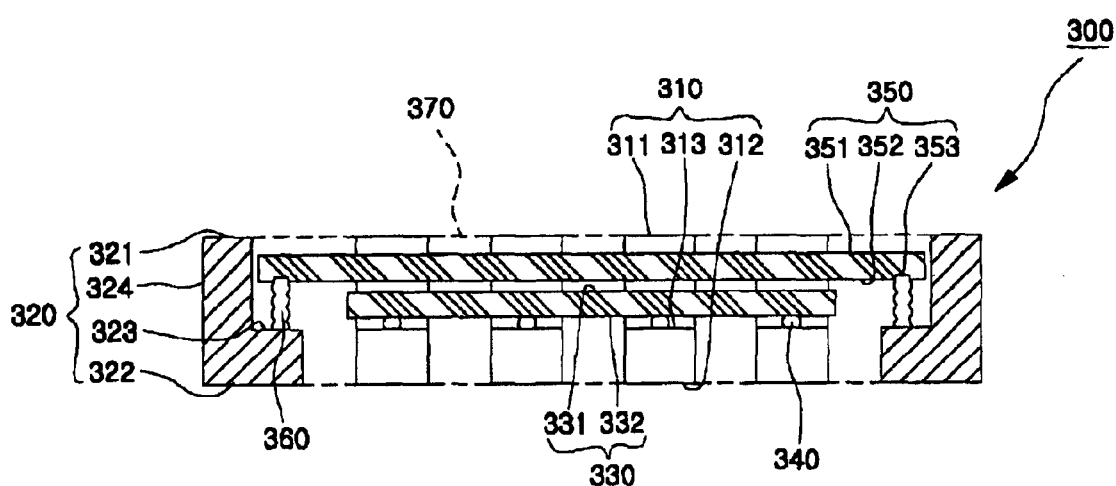
FIG. 9 is a cross-sectional view of a semiconductor package constructed in accordance with a third embodiment of the present invention.

Referring now to FIG. 9, there is shown a stackable semiconductor package 300 constructed in accordance with a third embodiment of the present invention. The semiconductor package 300 is substantially similar in structure to the above-described semiconductor package 200, with the sole distinction being that each enlarged second conductive ball 260 of the semiconductor package 200 is substituted with a plurality of small conductive balls 360 which are fused to each other in a generally straight line or linear array in the semiconductor package 300. In each fused set of conductive balls 360, one such conductive ball 360 is fused directly to a respective one of the bond pads 353 of the second semiconductor die 350 of the semiconductor package 300, with another conductive ball 360 in the same set being in direct contact with a respective one of the third surfaces 323 of the second leads 320 of the semiconductor package 300. It should be noted that the 300-series reference numerals included in FIG. 9 are used to identify the same structures as the corresponding 200-series reference numerals shown in FIG. 7B, with the sole distinction being that reference numeral 260 in FIG. 7B is used to label the second conductive balls 260 of the semiconductor package 200, whereas the reference numeral 360 in FIG. 9 is used to label the small conductive balls of the semiconductor package 300, each fused set of which mimics the functionality of one of the second conductive balls 260.

Referring now to FIGS. 10A–11B, there is shown a stackable semiconductor package 400 constructed in accordance with a fourth embodiment of the present invention. The semiconductor package 400 comprises a plurality of first leads 410 and a plurality of second leads 420. As best seen in FIG. 10B, the first and second leads 410, 420 are arranged in a generally quadrangular pattern or array, with the first leads 410 being segregated into two sets disposed in opposed relation to each other, and the second leads 420 themselves being segregated into two sets disposed in opposed relation to each other. The first leads 410 of one set are aligned with respective ones of the first leads 410 of the remaining set. Similarly, the second leads 420 of one set are aligned with respective ones of the second leads 420 of the remaining set.

Each of the first leads 410 defines a generally planar first or top surface 411 and a generally planar second or bottom surface 412 which is disposed in opposed relation to the first surface 411. Each first lead 410 further defines a generally planar third surface 413 which is also disposed in opposed relation to the second surface 412 and is disposed between the first and second surfaces 411, 412 (i.e., is laterally offset from the first surface 411). Also defined by each first lead 410 is a generally planar side surface 414 which extends perpendicularly between the first and second surfaces 411, 412.

Each of the second leads 420 has a configuration similar to that of the first leads 410. More particularly, each of the second leads 420 defines a generally planar first or top surface 421 and a generally planar second or bottom surface 422 which is disposed in opposed relation to the first surface 421. Each second lead 420 also defines a generally planar third surface 423 which is also disposed in opposed relation to the second surface 422 and positioned between the first and second surfaces 421, 422 (i.e., is laterally offset from the first surface 421). Also defined by each second lead 420 is a generally planar side surface 424 which extends perpendicularly between the first and second surfaces 421, 422.

Figure 10A:
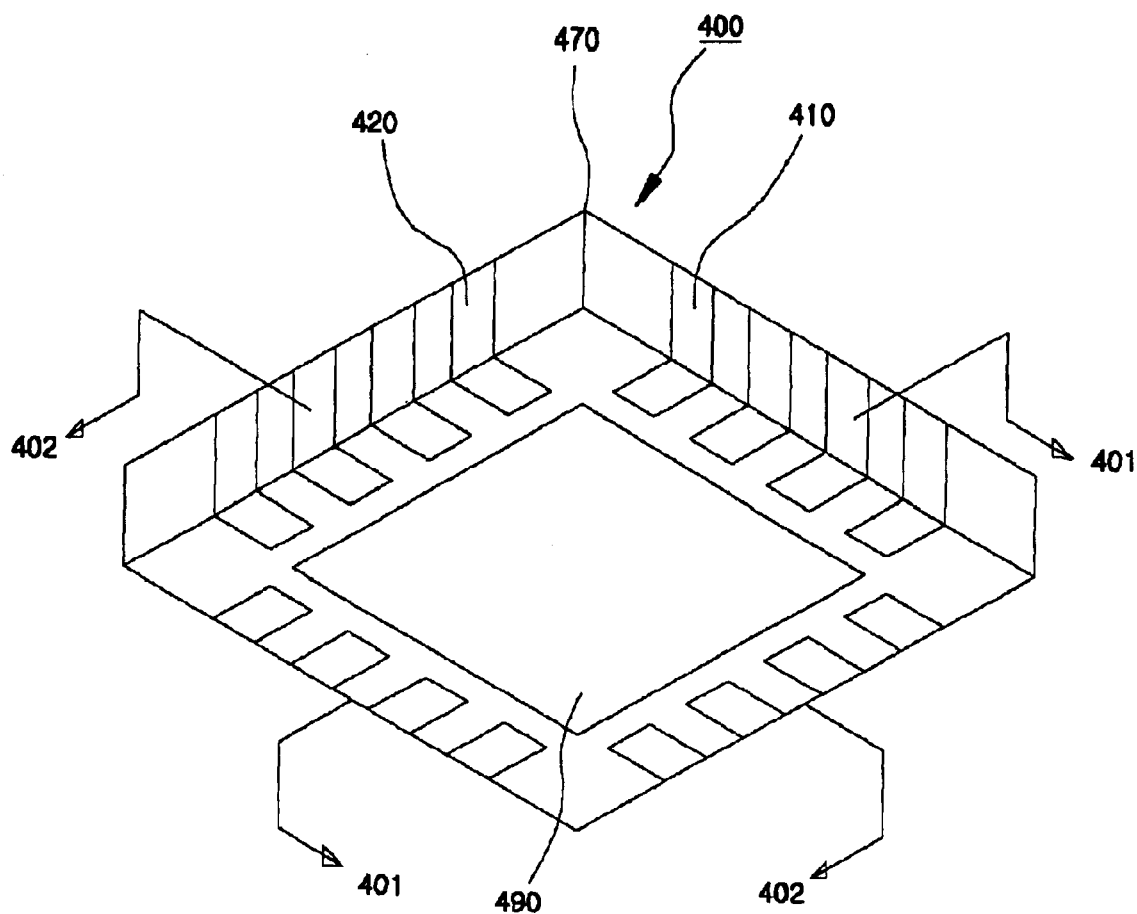
FIG. 10A is a bottom perspective view of a semiconductor package constructed in accordance with a fourth embodiment of the present invention.
Figure 10B:
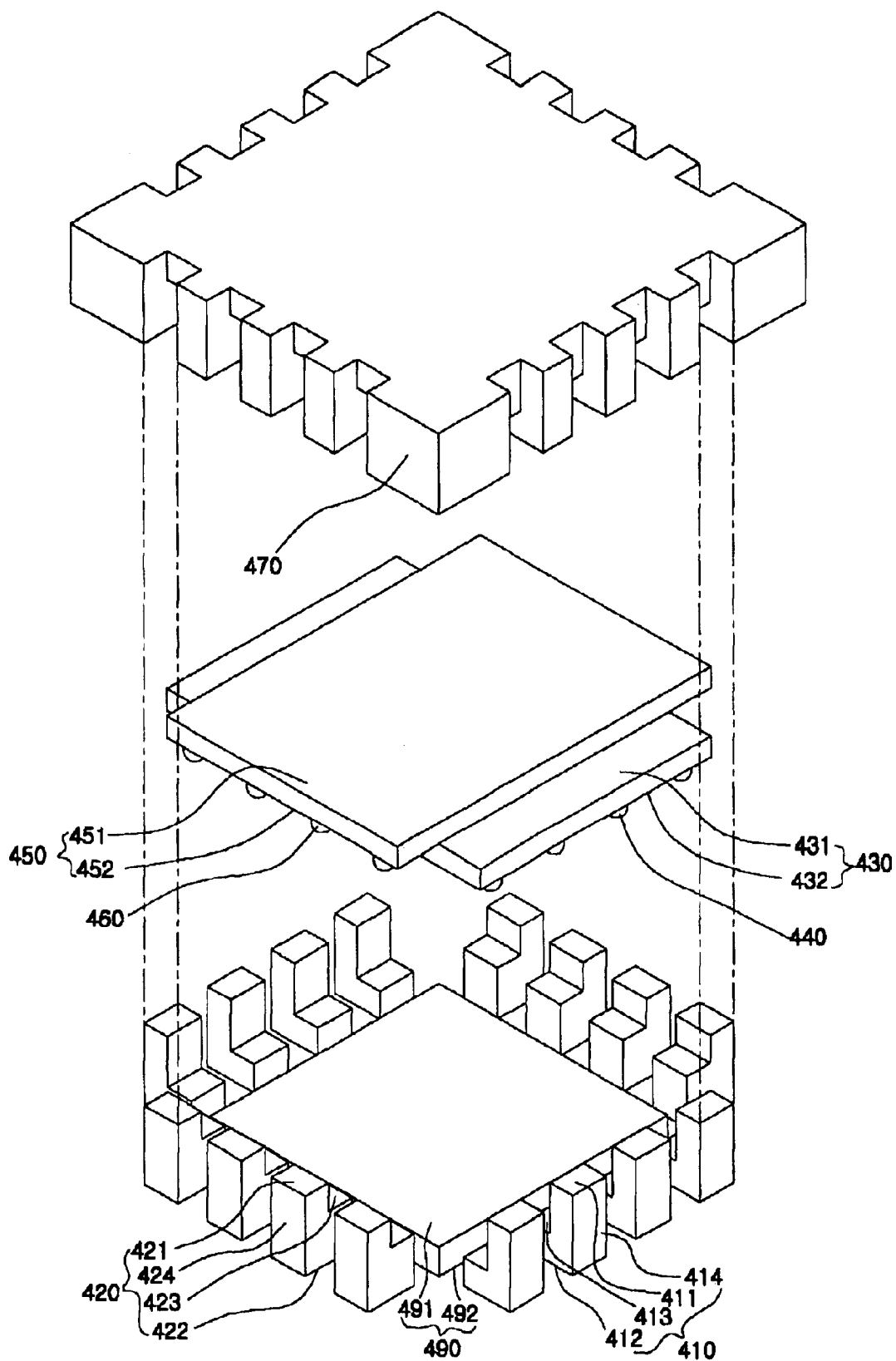
FIG. 10B is an exploded view of the semiconductor package shown in FIG. 10A.
Figure 11A:
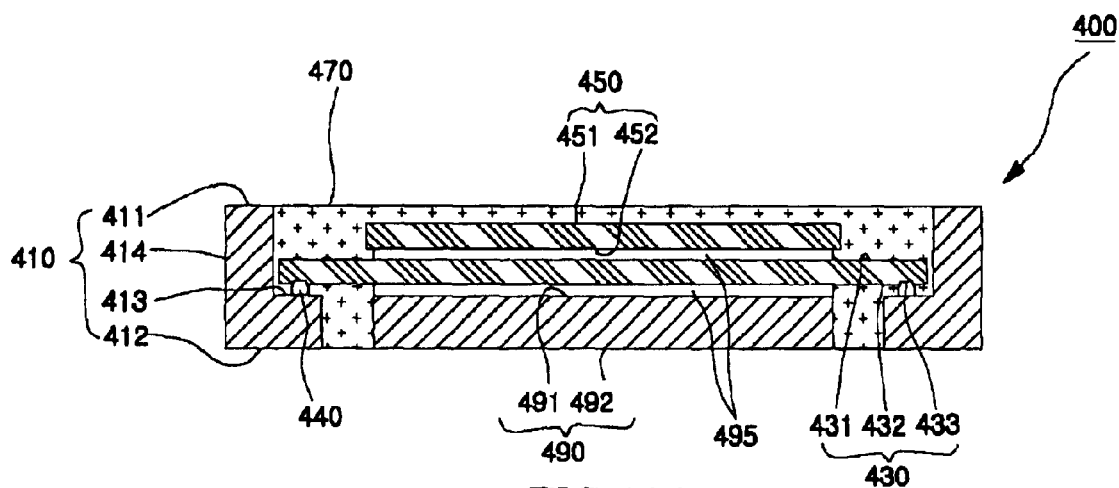
FIG. 11A is a cross-sectional view taken along line 401—401 of FIG. 10A.
Figure 11B:
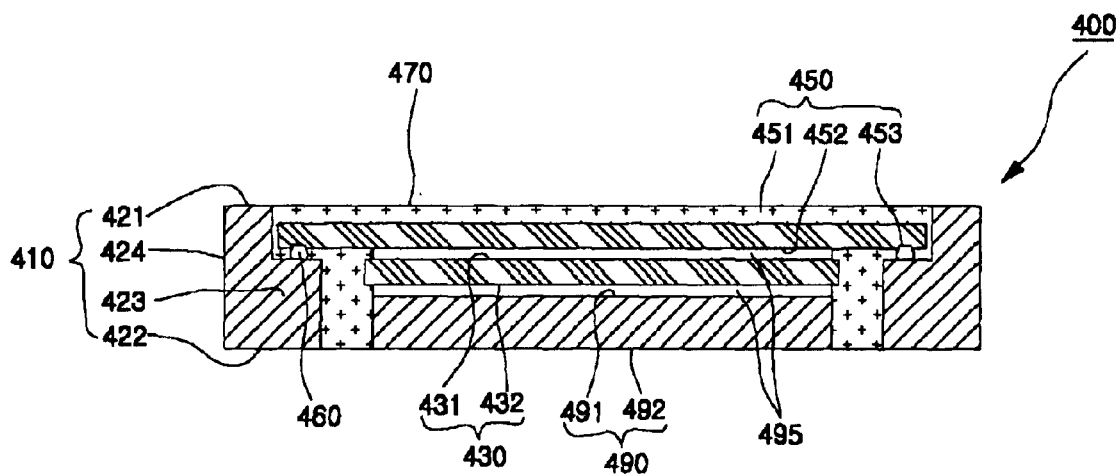
FIG. 11B is a cross-sectional view taken along line 402—402 of FIG. 10A.

As is most easily seen in FIG. 10B, the distinction between the structural attributes of the first and second leads 410, 420 lies in the thicknesses between the second and third surfaces 412, 413 of the first leads 410 and between the second and third surfaces 422, 423 of the second leads 420. These thickness distinctions are the same as those previously described in relation to the first and second leads 110, 120 of the semiconductor package 100. In this regard, the first leads 410 of the semiconductor package 400 are identically configured to the above-described first leads 110, with the second leads 420 of the semiconductor package 400 being identically configured to the above-described second leads 120.

In addition to the first and second leads 410, 420, the semiconductor package 400 further comprises a first semiconductor die 430 and a second semiconductor die 450. The first semiconductor die 430 defines a generally planar first or top surface 431 and a generally planar second or bottom surface 432 which is disposed in opposed relation to the first surface 431. Disposed on the second surface 432 of the first semiconductor die 430 is a plurality of bond pads 433. The bond pads 433 are arranged in a spaced pair of rows which extend along respective ones of an opposed pair of sides of the first semiconductor die 430.

The second semiconductor die 450 itself defines a generally planar first or top surface 451, and a generally planar second or bottom surface 452 which is disposed in opposed relation to the first surface 451. Disposed on the second surface 452 of the second semiconductor die 450 is a plurality of bond pads 453. The bond pads 453 are also preferably arranged in a spaced pair of rows which extend along respective ones of an opposed pair of sides of the second semiconductor die 450.

In the semiconductor package 400, the first semiconductor die 430 is electrically connected to the first leads 410 through the use of first conductive balls 440 in the same manner previously described in relation to the electrical connection of the first semiconductor die 130 to the first leads 110 via the first conductive balls 140 in the semiconductor package 100. Similarly, the second semiconductor die 450 is electrically connected to the second leads 420 via second conductive balls 460 in the same manner previously described in relation to the electrical connection of the second semiconductor die 150 to the second leads 120 via the second conductive balls 160 in the semiconductor package 100. Thus, the generally rectangular first and second semiconductor dies 430, 450 of the semiconductor package 400 also criss-cross each other when electrically connected to respective ones of the first and second leads 410, 420, and further reside in an area disposed between the first and second surfaces 411, 412 of the first leads 410 and the first and second surfaces 421, 422 of the second leads 420.

The semiconductor package 400 of the fourth embodiment further comprises a generally square heat sink 490 which is located in the generally square open area collectively defined by the first and second leads 410, 420. The heat sink 490 does not contact any of the first and second leads 410, 420. The heat sink 490 defines a generally planar first or top surface 491 and a generally planar second or bottom surface 492 which is disposed in opposed relation to the first surface 491. The first surface 491 of the heat sink 490 preferably extends in substantially co-planar relation to the third surfaces 413 of the first leads 410. The second surface 492 of the heat sink 490 preferably extends in substantially co-planar relation to the second surfaces 412 of the first leads 410 and the second surfaces 422 of the second leads 420. Due to the size and orientation of the heat sink 490, the second surface 432 of the first semiconductor package 430 is spaced from the first surface 491 of the heat sink 490 by a gap having a width approximately equal to the thickness of the first conductive balls 440. In the semiconductor package 400, the first surface 491 of the heat sink 490 is bonded to the second surface 432 of the first semiconductor die 430 through the use of a layer 495 of a thermo-conductive adhesive. Another layer 495 of thermo-conductive adhesive is also preferably used to bond the first surface 431 of the first semiconductor die 430 to the second surface 452 of the second semiconductor die 450. As a result of the inclusion of the thermo-conductive adhesive layers 495 in the semiconductor package 400, heat generated by the first and second semiconductor dies 430, 450 can be emitted to the second surface 492 of the heat sink 490 and to the first and second leads 410, 420.

In the semiconductor package 400, portions of the first and second leads 410, 420, a portion of the heat sink 490, the first and second semiconductor dies 430, 450, and the first and second conductive balls 440, 460 are encapsulated by an encapsulant material which, upon hardening, forms a package body 470 of the semiconductor package 400. As is seen in FIG. 10A, in the completed semiconductor package 400, the first, second and side surfaces 411, 412, 414 of each of the first leads 410 and the first, second and side surfaces 421, 422, 424 of each of the second leads 420 are exposed in and substantially flush with corresponding exterior surfaces of the package body 470. The second surface 492 of the heat sink 490 is also exposed in and substantially flush with an exterior surface of the package body 470, thus facilitating the emission of heat generated by the first and second semiconductor dies 430, 450.

Preferred methodologies for manufacturing the semiconductor package 400 mirror those described above in relation to the semiconductor package 100. The variation in such methodologies is that the first semiconductor package 430 is further bonded to the first surface 491 of the heat sink 490 via one layer 495 of the thermo-conductive adhesive, with the second semiconductor package 450 being bonded to the first semiconductor package 430 in the above-described manner via another layer 495 of the thermo-conductive adhesive.

Figure 12:
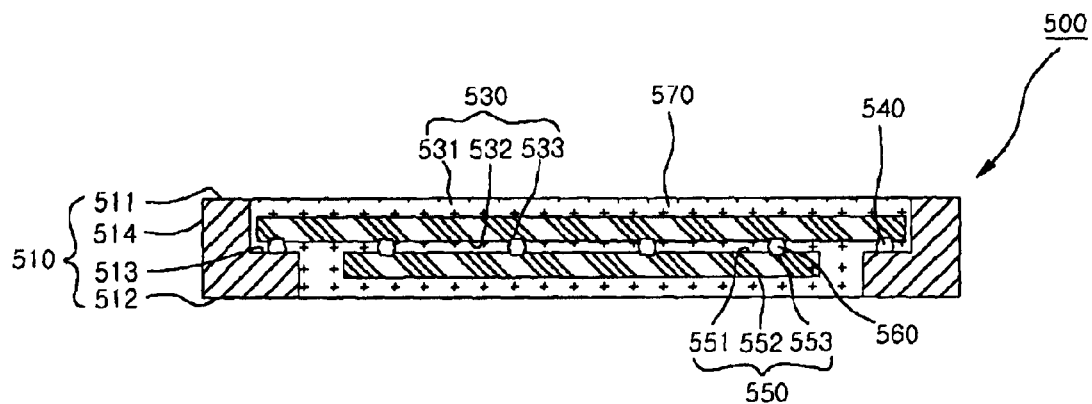
FIG. 12 is a cross-sectional view of a semiconductor package constructed in accordance with a fifth embodiment of the present invention.

Referring now to FIG. 12, there is shown a stackable semiconductor package 500 constructed in accordance with a fifth embodiment of the present invention. The semiconductor package 500 comprises a plurality of leads 510. The leads 510 may be segregated into two sets which are disposed in opposed relation to each other or, alternatively, arranged in a generally square or quadrangular pattern. If only two sets or rows of leads 510 are included in the semiconductor package 500, the leads 510 of one row will be disposed in opposed relation to respective ones of the leads 510 of the remaining row. If the leads 510 are arranged in a generally square pattern, each of the leads 510 will extend in opposed relation to a respective one of the remaining leads 510.

Each of the leads 510 defines a generally planar first or top surface 511 and a generally planar second or bottom surface 512 which is disposed in opposed relation to the first surface 511. Each lead 510 further defines a generally planar third surface 513 which is also disposed in opposed relation to the second surface 512 and is disposed between the first and second surfaces 511, 512 (i.e., is laterally offset from the first surface 511). Also defined by each lead 510 is a generally planar side surface 514 which extends perpendicularly between the first and second surfaces 511, 512. The thickness between the second and third surfaces 512, 513 is less than the thickness between the first and second surfaces 511, 512. More particularly, it is preferred that the thickness of each lead 510 between its second and third surfaces 512, 513 is in the range of from about twenty percent to eighty percent of the thickness between the first and second surfaces 511, 512.

The semiconductor package 500 further includes a first semiconductor die 530 which defines a generally. planar first surface 531 and a generally planar second surface 532 which is disposed in opposed relation to the first surface 531. Disposed on the second surface 532 of the first semiconductor die 530 is a plurality of bond pads 533. The bond pads 533 are arranged in a series of rows and columns on the second surface 532 of the first semiconductor die 530.

In the semiconductor package 500, the first semiconductor die 530 is electrically connected to the leads 510. Such electrical connection is facilitated through the use of first conductive balls 540 which electrically connect the peripheral bond pads 533 of the first semiconductor die 530 to the third surfaces 513 of respective ones of the leads 510. In this regard, the spacing between the leads 510 is such that the peripheral bond pads 533 of the first semiconductor die 530 are positionable into overlapping relation to respective ones of the third surfaces 513 of the leads 510. Accordingly, the first conductive balls 540 are used to facilitate the electrical connection of the bond pads 533 to respective ones of the third surfaces 513, thus in turn facilitating the electrical connection of the first semiconductor die 530 to the leads 510.

In addition to the first semiconductor die 530, the semiconductor package 500 includes a second semiconductor die 550 which defines a generally planar first surface 551 and a generally planar second surface 552 which is disposed in opposed relation to the first surface 551. Disposed on the second surface 552 is a plurality of bond pads 553 which are also preferably arranged in a series of rows and columns. The second semiconductor die 550 is preferably smaller than the first semiconductor die 530, and is located in the area or opening defined between the leads 510.

In the semiconductor package 500, second conductive balls 560 are fused to respective ones of the bond pads 553 of the second semiconductor die 550. The second conductive balls 560 are also fused to respective ones of the interior bond pads 533 of the first semiconductor die 530. Thus, the second conductive balls 560 facilitate the electrical connection of the first and second semiconductor dies 530, 550 to each other.

In the semiconductor package 500, portions of the leads 510, the first and second semiconductor dies 530, 550, and the first and second conductive balls 540, 560 are encapsulated by an encapsulant material which, upon hardening, forms a package body 570 of the semiconductor package 500. In the completed semiconductor package 500, the first, second and side surfaces 511, 512, 514 of the leads 510 are exposed in and substantially flush with corresponding exterior surfaces of the package body 570.

In one preferred method for manufacturing the semiconductor package 500, a leadframe is initially provided which includes the leads 510 having the above-described structural attributes and arranged in either a spaced pair of rows or a quadrangular array. Thereafter, the first conductive balls 540 are fused to respective ones of those bond pads 533 which extend along an opposed pair or all four peripheral edges of the first semiconductor die 530. The second conductive balls 560 are then fused to respective ones of the remaining interior bond pads 533 of the first semiconductor die 530.

Upon the completion of the above-described fusing operation, the first conductive balls 540 are placed into contact with respective ones of the third surfaces 513 of the leads 510. The bond pads 553 of the second semiconductor die 550 are then placed into direct contact with respective ones of the second conductive balls 560 fused to the first semiconductor die 530. As will be recognized, the arrangement of bond pads 553 on the second semiconductor die 550 is complementary to that of the interior or non-peripheral bond pads 533 of the first semiconductor die 530. Thereafter, the first and second conductive balls 540, 560 are reflowed, and then refrigerated, thus facilitating the firm affixation and electrical connection of the first semiconductor die 530 to the leads 510 via the first conductive balls 540 and the firm affixation and electrical connection of the second semiconductor die 550 to the first semiconductor die 530 via the second conductive balls 560. Those of ordinary skill in the art will recognize that the above-described reflow process need not necessarily occur simultaneously. In this regard, the first semiconductor die 530 can be electrically connected to the leads 510 via a reflow of the first conductive balls 540 prior to the electrical connection of the second semiconductor die 550 to the first semiconductor die 530 via the reflow of the second conductive balls 560. Alternatively, the second conductive balls 560 may be reflowed to facilitate the electrical connection of the second semiconductor die 550 to the first semiconductor die 530 prior to the reflow of the first conductive balls 540 to facilitate the electrical connection of the first semiconductor die 530 to the leads 510.

Subsequent to the completion of the electrical connection processes described above, the leads 510 and first and second semiconductor dies 530, 550 are placed into a mold of a predetermined shape, with the encapsulating material used to form the package body 570 thereafter being injected into the mold. The mold is shaped such that upon the hardening of the encapsulating material, the first, second and side surfaces 511, 512, 514 of each of the leads 510 are exposed within the package body 570 as indicated above.

Figure 13:
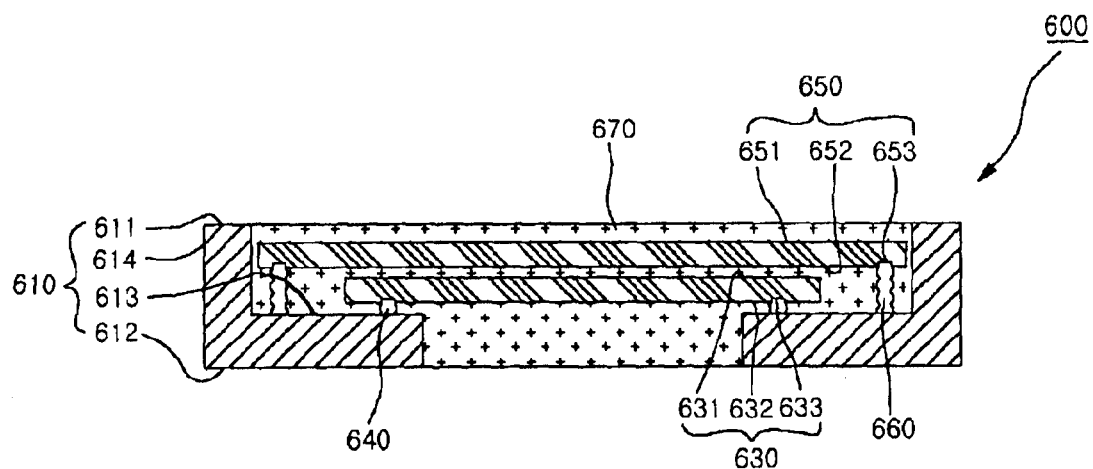
FIG. 13 is a cross-sectional view of a semiconductor package constructed in accordance with a sixth embodiment of the present invention.

Referring now to FIG. 13, there is shown a stackable semiconductor package 600 constructed in accordance with a sixth embodiment of the present invention. The semiconductor package 600 comprises a plurality of leads 610 which are arranged in either a spaced pair of rows or a quadrangular array in the same manner described above in relation to the leads 510 of the semiconductor package 500. Each of the leads 610 defines a generally planar first or top surface 611 and a generally planar second or bottom surface 612 which is disposed in opposed relation to the first surface 611. Each lead 610 further defines a generally planar third surface 613 which is also disposed in opposed relation to the second surface 612 and is disposed between the first and second surfaces 611, 612 (i.e., is laterally offset from the first surface 611). Also defined by each first lead 610 is a generally planar side surface 614 which extends perpendicularly between the first and second surfaces 611, 612.

In addition to the leads 610, the semiconductor package 600 comprises a first semiconductor die 630 and a second semiconductor die 650. The first semiconductor die 630 defines a generally planar first or top surface 631 and a generally planar second or bottom surface 632 which is disposed in opposed relation to the first surface 631. Disposed on the second surface 632 of the first semiconductor die 630 is a plurality of bond pads 633. The bond pads 633 preferably extend along an opposed pair or all four peripheral sides of the first semiconductor die 630 which has a quadrangular shape.

The second semiconductor die 650 also has a quadrangular shape and defines a generally planar first or top surface 651, and a generally planar second or bottom surface 652 which is disposed in opposed relation to the first surface 651. Disposed on the second surface 652 of the second semiconductor die 650 is a plurality of bond pads 653. The bond pads 653 are also preferably arranged so as to extend along an opposed pair or all four peripheral edges of the second semiconductor die 650. The size of the second semiconductor die 650 exceeds that of the first semiconductor die 630 for reasons which will be described in more detail below.

In the semiconductor package 600, the first semiconductor die 630 is electrically connected to the leads 610. Such electrical connection is facilitated through the use of first conductive balls 640 which electrically connect the bond pads 633 of the first semiconductor die 630 to the third surfaces 613 of respective ones of the leads 610. In this regard, the spacing between the leads 610 is such that the bond pads 633 of the first semiconductor die 630 are positionable into overlapping relation to respective ones of the third surfaces 613. Accordingly, the first conductive balls 640 are used to facilitate the electrical connection of the bond pads 633 to respective ones of the third surfaces 613 in the above-described manner, thus in turn facilitating the electrical connection of the first semiconductor die 630 to the first leads 610.

The second semiconductor die 650 is itself electrically connected to the leads 610. In this regard, small second conductive balls 660 are fused to each other in the manner described above in relation to the conductive balls 360 of the semiconductor package 300 for purposes of electrically connecting the bond pads 653 of the second semiconductor die 650 to respective ones of the third surfaces 613 of the leads 610. As shown in FIG. 13, the height of each fused set of the second conductive balls 660 is such that the second surface 652 of the second semiconductor die 650 is separated from the first surface 631 of the first semiconductor die 630 by a narrow gap. It will be recognized that the first and second semiconductor dies 630, 650 may each be electrically connected to all of the leads 610, or to only one or more of the leads 610 in any combination.

In the semiconductor package 600, portions of the leads 610, the first and second semiconductor dies 630, 650, and the first and second conductive balls 640, 660 are encapsulated by an encapsulant material which, upon hardening, forms a package body 670 of the semiconductor package 600. In the completed semiconductor package 600, the first, second and side surfaces 611, 612, 614 of each of the leads 610 are exposed in and substantially flush with corresponding exterior surfaces of the package body 670.

Preferred methodologies for manufacturing the semiconductor package 600 mirror those described above in relation to the semiconductor package 500. Initially, the smaller first semiconductor package 630 is electrically connected to the third surfaces 613 of the leads 610 via the reflow of the first conductive balls 640 which are first fused to the bond pads 633 and thereafter placed into direct contact with respective ones of the third surfaces 613 of the leads 610. Thereafter, the second conductive balls 660 are formed to facilitate the electrical connection of the second semiconductor die 650 to the leads 610 in the above-described manner. The above-described encapsulation step completes the manufacturing process. It will be recognized that the second conductive balls 660 may optionally be replaced with a single second conductive ball similar to the second conductive ball 260 described above in relation to the semiconductor package 200, with such single conductive ball being reflowed after being initially fused to a respective one of the bond pads 653 and thereafter being placed into direct contact with a respective one of the third surfaces 613.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A stackable semiconductor package, comprising:
    a plurality of first and second leads arranged in a generally quadrangular array having one pair of opposed sides defined by the first leads and one pair of opposed sides defined by the second leads, the first and second leads each including:
        a generally planar first surface;
        a generally planar second surface disposed in opposed relation to the first surface; and
        a generally planar third surface disposed in opposed relation to the second surface and positioned between the first and second surfaces;
    a first semiconductor die electrically connected to the third surfaces of the first leads;
    a second semiconductor die electrically connected to the third surfaces of the second leads; and
    a package body at least partially encapsulating the first and second leads and the first and second semiconductor dies such that the first and second surfaces of each of the first and second leads are exposed in the package body.

2. The semiconductor package of claim 1 wherein:
    the first and second semiconductor dies each include:
        a generally planar first surface;
        a generally planar second surface disposed in opposed relation to the first surface; and
        a plurality of bond pads disposed on the second surface;
    a plurality of first conductive balls are used to electrically connect the bond pads of the first semiconductor die to the third surfaces of respective ones of the first leads;
    a plurality of second conductive balls are used to electrically connect the bond pads of the second semiconductor die to the third surfaces of respective ones of the second leads; and
    the package body encapsulates the first and second conductive balls.

3. The semiconductor package of claim 2 wherein the first and second leads and the first and second semiconductor dies are sized and arranged relative to each other such that the bond pads of the first semiconductor die are positionable into overlapping relation to the third surfaces of respective ones of the first leads and the bond pads of the second semiconductor die are positionable into overlapping relation to the third surfaces of respective ones of the second leads.

4. The semiconductor package of claim 1 wherein the first and second semiconductor dies are generally rectangular and stacked in a criss-cross configuration when electrically connected to respective ones of the first and second leads.

5. The semiconductor package of claim 1 wherein each of the first leads has a thickness between the second and third surfaces thereof which is less than a thickness of each of the second leads between the second and third surfaces thereof.

6. The semiconductor package of claim 1 wherein:
    the first and second leads each further include a generally planar side surface extending perpendicularly between the first and second surfaces; and
    the package body at least partially encapsulates the first and second leads such that the first, second and side surfaces of each of the first and second leads are exposed in the package body.

7. The semiconductor package of claim 1 wherein the first surface of the first semiconductor die extends in generally co-planar relation to the third surfaces of the second leads.

8. The semiconductor package of claim 1 wherein each of the first leads has a thickness between the second and third surfaces thereof which is substantially equal to a thickness of each of the second leads between the second and third surfaces thereof.

9. The semiconductor package of claim 1 further comprising a heat sink defining opposed, generally planar first and second surfaces, the first and second leads extending about the heat sink in spaced relation thereto.

10. The semiconductor package of claim 9 wherein the first surface of the heat sink extends in generally co-planar relation to the third surfaces of the first leads.

11. The semiconductor package of claim 9 wherein:
    the second surface of the first semiconductor die is bonded to the first surface of the heat sink via a first layer of a thermo-conductive adhesive;
    the second surface of the second semiconductor die is bonded to the first surface of the first semiconductor die via a second layer of a thermo-conductive adhesive; and
    the package body partially encapsulates the heat sink such that the second surface of the heat sink is exposed in the package body.

12. The semiconductor package of claim 1, further in combination with a second semiconductor package identically configured to the semiconductor package and stacked thereon, the first surfaces of the first and second leads of the semiconductor package being electrically connected to respective ones of the second surfaces of the first and second leads of the second semiconductor package.

13. A stackable semiconductor package comprising:
a plurality of leads arranged in at least one spaced pair of rows, each of the leads including:
  a generally planar first surface;
  a generally planar second surface disposed in opposed relation to the first surface; and
  a generally planar third surface disposed in opposed relation to the second surface and positioned between the first and second surfaces;
a first semiconductor die electrically connected to the third surface of at least one of the leads;
a second semiconductor die electrically connected to the third surfaces surface of at least one of the leads; and
a package body at least partially encapsulating the leads and the first and second semiconductor dies such that the first and second surfaces of each of the leads are exposed in the package body.

14. The semiconductor package of claim 13 wherein the leads are arranged in a generally quadrangular array having two pairs of opposed sides.

15. The semiconductor package of claim 13 wherein:
the first and second semiconductor dies each include:
  a generally planar first surface;
  a generally planar second surface disposed in opposed relation to the first surface; and
  a plurality of bond pads disposed on the second surface;
a plurality of first conductive balls are used to electrically connect the bond pads of the first semiconductor die to the third surfaces of respective ones of the leads;
a plurality of second conductive balls are used to electrically connect the bond pads of the second semiconductor die to the third surfaces of respective ones of the leads; and
the package body encapsulates the first and second conductive balls.

16. The semiconductor package of claim 15 herein the leads and the first and second semiconductor dies are sized and arranged relative to each other such that the bond pads of the first semiconductor die are positionable into overlapping relation to the third surfaces of respective ones of the leads and the bond pads of the second semiconductor die are positionable into overlapping relation to the third surfaces of respective ones of the leads.

17. The semiconductor package of claim 13 wherein the second semiconductor package has a size exceeding that of the first semiconductor package, and a portion of the second surface of the second semiconductor package overlaps and is spaced from a portion of the first surface of the first semiconductor package.

18. The semiconductor package of claim 13 wherein:
the leads each further include a generally planar side surface extending perpendicularly between the first and second surfaces; and
the package body at least partially encapsulates the leads such that the first, second and side surfaces of each of the leads are exposed in the package body.

19. A stackable semiconductor package, comprising:
a plurality of first and second leads arranged in a generally quadrangular array having one pair of opposed sides defined by the first leads and one pair of opposed sides defined by the second leads, the first and second leads each including:
  a generally planar first surface;
  a generally planar second surface disposed in opposed relation to the first surface; and
  a generally planar third surface disposed in opposed relation to the second surface and positioned between the first and second surfaces, each of the first leads having a thickness between the second and third surfaces thereof which is less than a thickness of each of the second leads between the second and third surfaces thereof;
a first semiconductor die having a plurality of bond pads which are positioned in overlapping relation and electrically connected to the third surfaces of respective ones of the first leads;
a second semiconductor die having a plurality of bond pads which arc positioned in overlapping relation and electrically connected to the third surfaces of respective ones of the second leads; and
a package body at least partially encapsulating the first and second leads and the first and second semiconductor dies such that the first and second surfaces of each of the first and second leads are exposed in the package body.

20. The semiconductor package of claim 19 wherein:
a plurality of first conductive balls are used to electrically connect the bond pads of the first semiconductor die to the third surfaces of respective ones of the first leads;
a plurality of second conductive balls are used to electrically connect the bond pads of the second semiconductor die to the third surfaces of respective ones of the second leads; and
the package body encapsulates the first and second conductive balls.

21. The semiconductor package of claim 19 wherein the first and second semiconductor dies are generally rectangular and stacked in a criss-cross configuration when electrically connected to respective ones of the first and second leads.

22. The semiconductor package of claim 19 wherein:
the first and second leads each further include a generally planar side surface extending perpendicularly between the first and second surfaces; and
the package body at least partially encapsulates the first and second leads such that the first, second and side surfaces of each of the first and second leads are exposed in the package body.

23. The semiconductor package of claim 19 wherein the first surface of the first semiconductor die extends in generally co-planar relation to the third surfaces of the second leads.

* * * * *